United States Patent
Knudsen

Patent Number: 5,935,466
Date of Patent: Aug. 10, 1999

[54] SYSTEM AND METHOD FOR REDUCING INACCURACIES CAUSED BY TEMPERATURE DRIFT IN D/A CONVERTERS

[75] Inventor: Niels Knudsen, Austin, Tex.

[73] Assignee: National Instruments Corporation, Austin, Tex.

[21] Appl. No.: 08/929,500

[22] Filed: Sep. 15, 1997

[51] Int. Cl.$^6$ .................................................. H03M 1/00
[52] U.S. Cl. ........................... 219/209; 341/119; 374/152
[58] Field of Search .................................... 219/209, 201, 219/494; 374/152; 324/765, 105; 341/119, 144

[56] References Cited

U.S. PATENT DOCUMENTS 5,319,370   6/1994   Signore et al. ........................... 341/143

FOREIGN PATENT DOCUMENTS 3-101314   4/1991   Japan .

*Primary Examiner*—John A. Jeffery
*Attorney, Agent, or Firm*—Conley, Rose & Tayon; Jeffrey C. Hood

[57] ABSTRACT

A system and method for monitoring and regulating the temperature of a D/A converter, thereby reducing inaccuracies caused by temperature drift in the D/A converter comprises a heating device, preferably a transistor, in thermal contact with the D/A converter. The system further includes a temperature sensing control circuit coupled to the D/A converter and the heating device. The temperature sensing control circuit receives a desired temperature signal Vin which indicates a desired temperature for the D/A converter. The temperature sensing control circuit measures the temperature on the D/A converter by calculating a difference in voltage between the base voltage of the D/A converter and the power input signal to the D/A converter. The temperature sensing control circuit then provides a control output to the heating device to regulate the temperature of the D/A converter, wherein the control output is generated in response to the measured temperature of the D/A converter and the desired temperature for the D/A converter. The temperature sensing control circuit operates to repeatedly measure the temperature on the D/A converter and repeatedly provide the control output to the heating device to regulate the temperature of the D/A converter. This operates to reduce inaccuracies caused by temperature drift in the D/A converter.

21 Claims, 5 Drawing Sheets

Simplified Schematic

Diagram for temperature control servoloop

SYSTEM AND METHOD FOR REDUCING INACCURACIES CAUSED BY TEMPERATURE DRIFT IN D/A CONVERTERS

FIELD OF THE INVENTION

This invention relates to the art of digital-to-analog (D/A) converters, and more specifically to reducing inaccuracies caused by temperature drift in specific types of D/A converters

DESCRIPTION OF THE RELATED ART

D/A converters are used in a wide variety of different applications involving waveform synthesis, DC control, voltage generation etc. D/A converters are also used in many different AID converter topologies, for example in successive approximation converters and multi-bit sigma delta converters. In all of the above mentioned applications, the accuracy of digital to analog conversion is affected by parameters such as gain accuracy, offset accuracy and linearity errors (often measured as differential and integral non linearities).

In most applications the effect of these errors can be compensated for by special calibration circuitry. In A/D Converters, for example, the effect of errors can by compensated for or eliminated by a digital translation of the output of the converter. For more information on performing multi-bit linearization in A/D converters, please see U.S. patent application Ser. No. 08/772,785 titled "System and Method for Generating a Sigma-Delta Correction Circuit" and U.S. patent application Ser. No. 08/771,480 titled "System and Method for Reducing Errors in a Delta-Sigma Converter", whose inventor is Niels Knudsen, and which is assigned to National Instruments Corporation.

However, the accuracy of the D/A converter is affected by temperature variations. In applications where the inaccuracies has been compensated for, the temperature variation can easily alter the residual accuracy.

A common way of solving this problem is to regulate the temperature of the D/A converter. Ideally the temperature should be held constant, independently of the surrounding or ambient temperature. This can be difficult and costly. If the D/A Converter is mounted on a PWB, it may be necessary to thermally isolate the whole PWB from its surroundings and then regulate the temperature for the PWB. This is impractical for computer plug-in boards.

A less ideal solution is to regulate the temperature of the package in which the D/A converter resides. However, due to thermal paths from the D/A converter to the surroundings or ambient air, the temperature of the D/A converter chips themselves may vary slightly as a function of temperature variations in the surroundings.

Therefore, an improved system and method is desired for reducing inaccuracies caused by temperature drift in D/A converters.

SUMMARY OF THE INVENTION

The present invention comprises a system and method for monitoring and regulating the temperature of a D/A converter, thereby reducing inaccuracies caused by temperature drift in the D/A converter. The system comprises a heating device in thermal contact with the D/A converter. In the preferred embodiment, the D/A converter is comprised in a chip, and the heating device is mounted on the chip in thermal contact with the chip. The heating device is preferably a transistor.

The system further includes a temperature sensing control circuit coupled to the D/A converter and the heating device. The temperature sensing control circuit receives a desired temperature signal Vin which indicates a desired temperature for the D/A converter. The temperature sensing control circuit includes a first input which is coupled to receive a base voltage of the D/A converter and a second input which is coupled to receive a power input signal to the D/A converter. The temperature sensing control circuit measures the temperature on the D/A converter by calculating a difference in voltage between the base voltage of the D/A converter and the power input signal to the D/A converter. The temperature sensing control circuit then provides a control output to the heating device to regulate the temperature of the D/A converter, wherein the control output is generated in response to the measured temperature of the D/A converter and the desired temperature for the D/A converter.

The temperature sensing control circuit operates to repeatedly measure the temperature on the D/A converter and repeatedly provide the control output to the heating device to regulate the temperature of the D/A converter. This operates to reduce inaccuracies caused by temperature drift in the D/A converter.

A method of regulating the temperature of a D/A converter according to the present invention comprises first measuring the temperature on the D/A converter. The temperature is measured by calculating the difference in voltage between a base voltage and a power input signal to the D/A converter. The method then generates a control signal based on the measured temperature of the D/A converter and the desired temperature for the D/A converter and provides the control signal to the heating device. As a result, the heating device generates heat to the D/A converter. The above steps of measuring, providing and generating are repeated to regulate the temperature of the D/A converter.

BRIEF DESCRIPTION OF THE DRAWINGS

A better understanding of the present invention can be obtained when the following detailed description of the preferred embodiment is considered in conjunction with the following drawings, in which.

Figure 1:
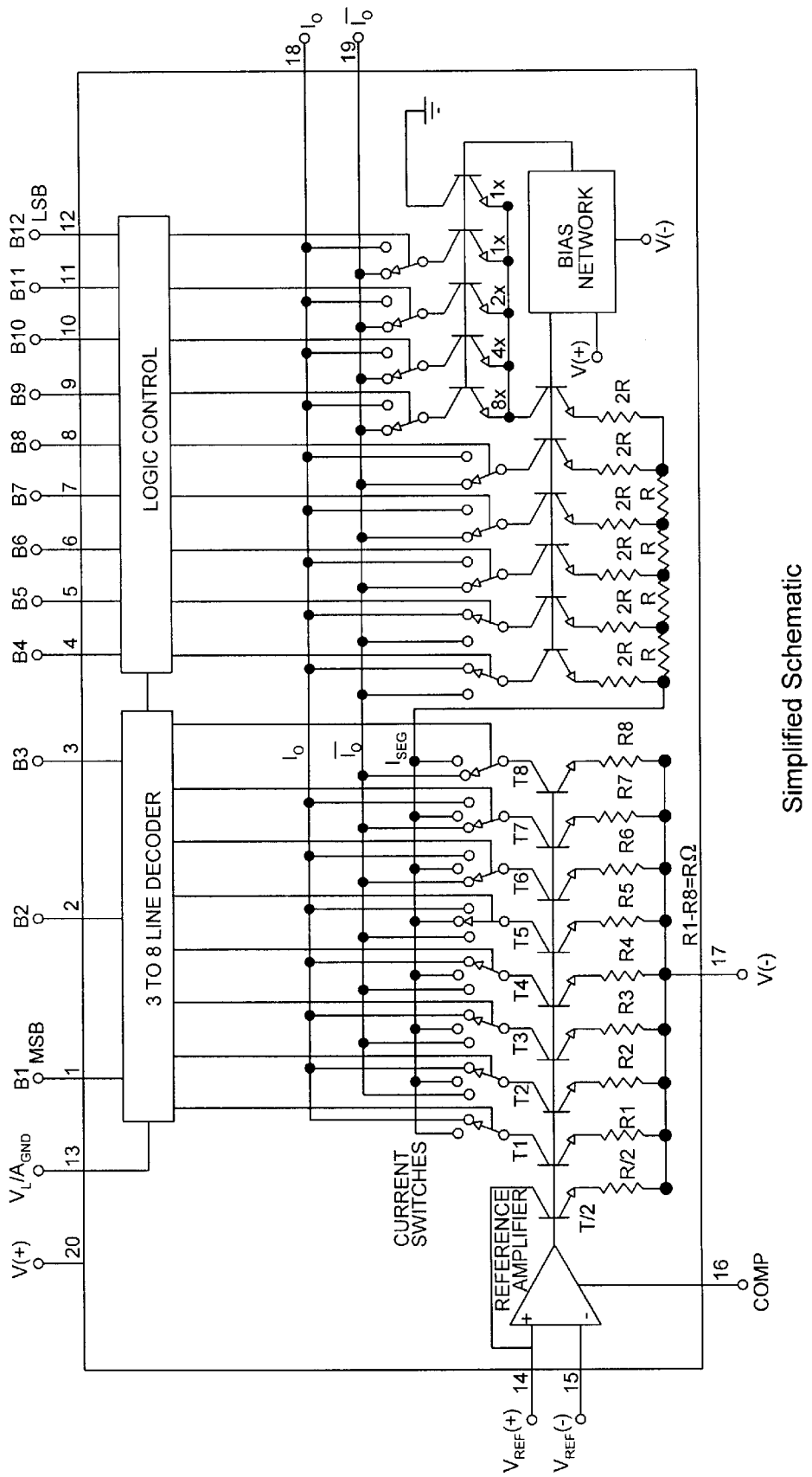
FIG. 1 illustrates a typical current output 8-bit D/A converter which is used to explain the temperature measurement operation of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENT

Incorporation by Reference

U.S. Patent application Ser. No. 08/772,785 titled "System and Method for Generating a Sigma-Delta Correction Circuit" and whose inventor is Niels Knudsen, and which is assigned to National Instruments Corporation, is hereby incorporated by reference in its entirety.

U.S. Patent application Ser. No. 08/771,480 titled "System and Method for Reducing Errors in a Delta-Sigma Converter", and whose inventor is Niels Knudsen, and which is assigned to National Instruments Corporation, is hereby incorporated by reference in its entirety.

The present invention provides a system and method for regulating the temperature of a chip which comprises a D/A converter. Regulation of the temperature on the chip allows for reducing inaccuracies caused by temperature drift in D/A converters. The present invention also includes a novel system and method for accurately determining the temperature of the chip for specific types of D/A converters.

FIG. 1 illustrates an overview of a typical current output 8-bit D/A converter. More specifically, FIG. 1 illustrates an Analog Devices DAC312 D/A converter. The data sheet for this D/A converter is generally available from Analog Devices and can presently be found at:

http://www.analog.com/products/sheets/DAC312.html

It is noted that the present invention does not actually work for this type of D/A converter, and thus the D/A converter of FIG. 1 is used only for explanation purposes.

The D/A converter shown in FIG. 1 includes nine current generators comprising the resistors denoted R1–R8 and R/2 and the nine connected transistors labeled T1–T8 and T/2. The current generators are referred to as I1–I8 and I/2, wherein each current generator includes a resistor and its corresponding transistor. The resistors R1–R8 have the same resistance, while R/2 has half the resistance of the resistors R1–R8. The transistors T1–T8 presumably have equal geometrical sizes, while transistor T2 presumably has double the size of transistors T1–T8. The nine transistors and resistors thus form nine current generators. The collectors of transistors T1 to T8 each conducts one half of the current flowing into the collector of T/2.

The sum of the current generators I1–I8 determines the gain of the D/A converter. The precision of the matching of the generators affects the linearity of the converter. The base of the transistors acts as a primary reference input to the converter. The higher the base voltage is with respect to the pin V(–) the more current flow in the generators. However, due mainly to variations in the Vbe of the transistors as a function of temperature, the base voltages are not very suitable for applying the reference input to the converter.

For this reason the base voltage is supplied from a reference amplifier, as shown. The reference amplifier receives its feedback from current generator I/2. Assuming the reference amplifier is stable and has infinite gain, the reference amplifier forces I/2 to be equal to the reference current input to node Vref(+). The currents in I1–I8 are accordingly half of the reference current applied to Vref(+) and are substantially independent of the temperature.

According to the present invention, the system and method uses the difference in voltage between the base voltages and pin V(–), the 'primary reference input', as a measure of the temperature on T/2. This difference in voltage is also used as the measure of the temperature on the entire chip comprising the D/A converter.

Figure 2:
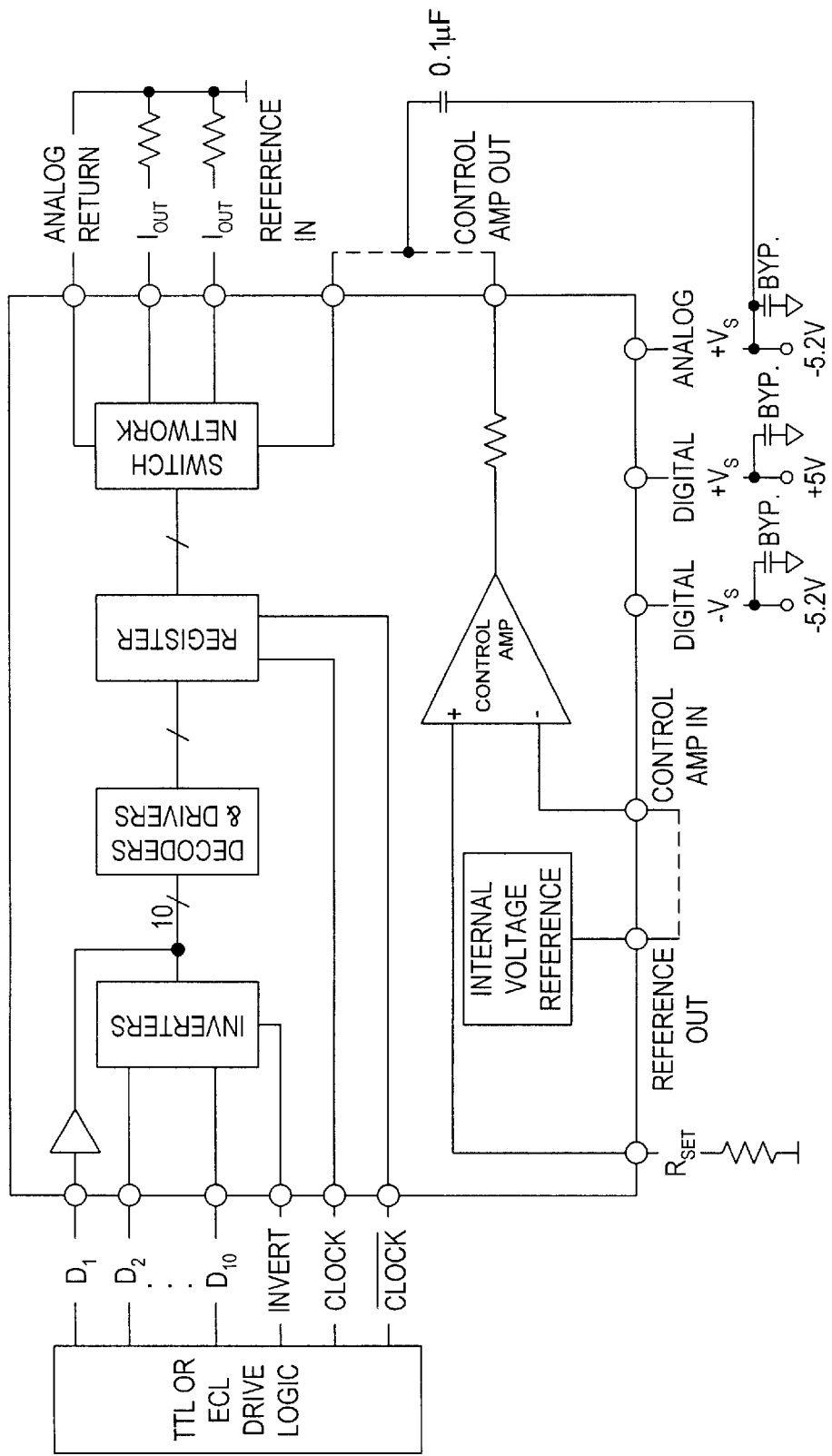
FIG. 2 is a functional block diagram of a D/A converter whose primary reference input is accessible from outside the chip, thereby enabling accurate temperature measurements according to the present invention.

FIG. 2 Analog Devices AD9720

FIG. 2 is a functional block diagram of the Analog Devices AD9720 D/A converter, which is similar to the DAC312 D/A converter shown in FIG. 1. It is noted that the Reference Amplifier in FIG. 1 is equivalent to the Control Amp in FIG. 2. Also, the base of the transistor T/2 in FIG. 1 is equivalent to the input "Reference In" in FIG. 2; the Vref(+) input in FIG. 1 is equivalent to "Rset" in FIG. 2; and the Vref(–) input in FIG. 1 is equivalent to the "Control Amp In" input of FIG. 2.

In addition, the AD9720 has a built-in resistor at the output of 'Control Amp' that, together with an external capacitor '0.1 uF' forms a low pass filter. Because of this filter, the AD9720 provides external access to the base of 'T/2', which on the DAC312 is buried inside the chip, but on the AD9720 is called 'Reference In'.

Thus, as shown in FIG. 2, for filtering purposes the primary reference input is accessible from outside the chip, thus enabling accurate temperature measurements of the chip. The present invention can thus be used in the AD9720 to accurately measure the temperature of the chip.

Referring back to FIG. 1, the characteristic between the chip temperature and the voltage between the base of T/2 and V(–) is:

$$Vtmp = Vbe(Iref, T) + Iref \times Rbase$$

where Iref is the reference current that flows in the transistor denoted "T/2", Rbase is the resistor denoted 'R/2'. ('R/2' was not used in the expression, since the "\" may be confused with the division operator), and T is the temperature of the chip. The voltage contribution from the transistor depends on the conducted current and the temperature of the chip. The voltage contribution from the resistor mainly depends on the current conducted. Provided the current is constant the expression can be rewritten to:

$$Vtmp = Vbeo + At \times (T - To) + Iref \times Rbase$$

$$Vtmp = Voff + At \times (T - To) + Iref \times Rbase$$

$$Vtmp = At \times T - Voff$$

where

Vbeo is the Vbe at temperature 20 deg Celsius (this is approximately 600 mV–800 mV and varies between individual chips), To is 20 deg Celsius, At is the temperature coefficient of Vbe (approximately –2.6 mV's per degree), and Rbase is the resistor at the base of the transistor. This also varies between individual chips.

Figure 4:
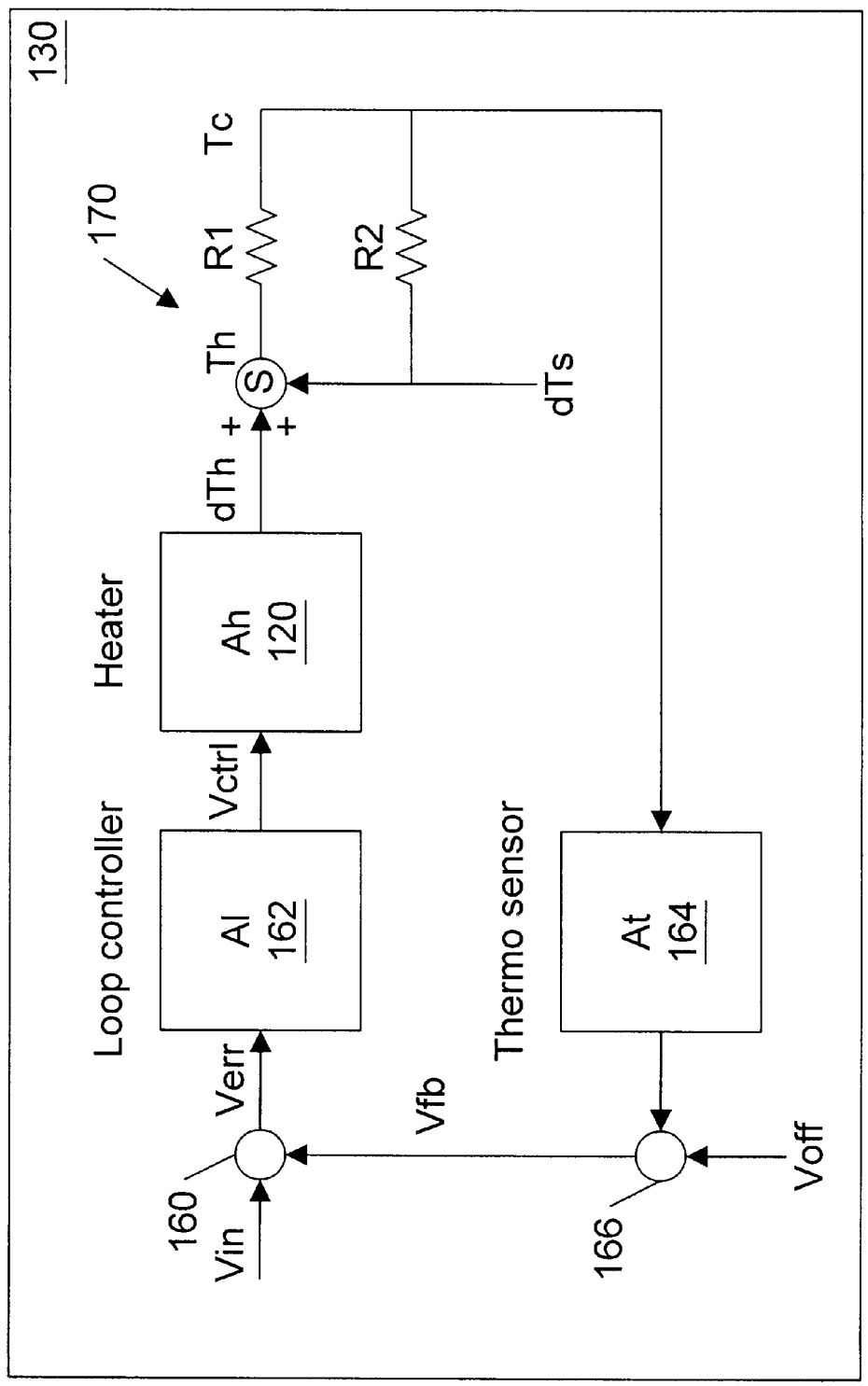
FIG. 4 illustrates the temperature regulation circuitry of FIG. 3.

The last expression of Vtmp is modelled by the thermo sensor 164 in FIG. 4.

The data sheet for the Analog Devices AD9720 D/A converter is available from Analog Devices and can presently be found at:

http://www.analog.com/products/sheets/AD9720.html

Operation of the Invention

Measuring the temperature of the chip enables the possibility for regulating the temperature of the chip. In one embodiment, the present invention includes attaching a heating device, for example a transistor, to the top of the component. This provides a simple and inexpensive way of regulating the temperature of the D/A converter. Regulating the amount of heat applied to the component by measuring the temperature of the chip enables operating the DAC at a constant and higher temperature, independently of the ambient or surrounding temperature.

Figure 3:
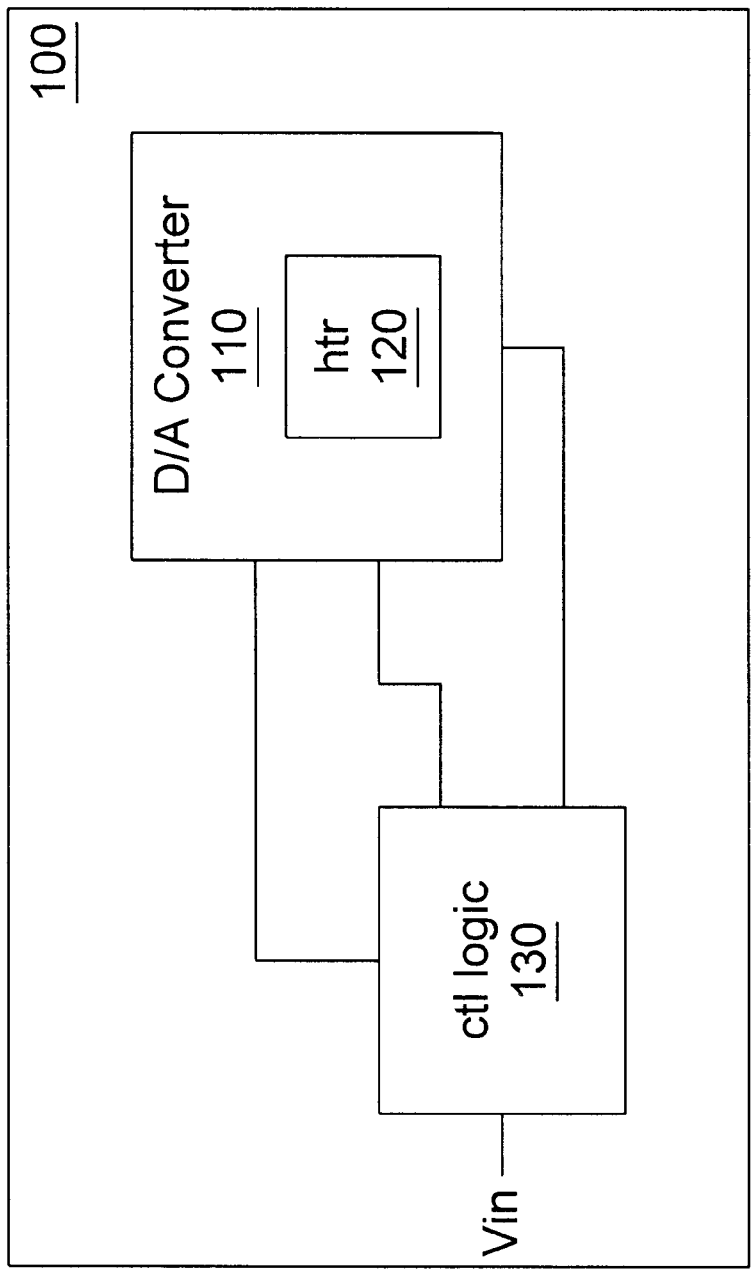
FIG. 3 illustrates a D/A converter which includes a heating device and which further includes temperature regulation circuitry according to the present invention.

FIG. 3—Embodiment of the Invention

FIG. 3 illustrates a printed circuit board (PCB) or printed wiring board (PWB) 100 which includes a D/A converter 110. In the preferred embodiment, the D/A converter is comprised on a chip 110, and in the following discussion the D/A converter 110 is sometimes referred to as chip 110. As shown, a heating device 120 is placed directly on the chip 110 in thermal contact with the chip. The heating device 120 preferably comprises a transistor, but may comprise other types of devices. The heating device 120 may also operate to provide both heating and cooling to the chip 110, it being important simply that the heating device enable some type of thermal or heat transfer with the chip 110 to effect the temperature of the chip 110.

The present invention further includes control logic 130 which is comprised on the PWB 100. As shown, the control logic 130 includes first and second inputs which are coupled to the D/A converter chip 110. A first input is coupled to receive a base voltage of the D/A converter, wherein the base voltage is a base voltage of a transistor comprised in the D/A converter. The second input is coupled to receive a power input signal to the D/A converter or chip 110, preferably a voltage V(−) which is provided as an input to the chip 110. The control logic 130 further includes an input receiving a desired temperature signal Vin, which indicates a desired temperature for the D/A converter or chip 110.

The control logic 130 operates to measure the temperature on the D/A converter 110 by calculating a difference in voltage between the base voltage of the D/A converter 110 and the power input signal to the D/A converter 110. The control circuit 130 then operates to provide a control output to the heating device 120 to regulate the temperature of the D/A converter 110. The control circuit 130 preferably generates a control output in response to the measured temperature of the D/A converter 110 and the desired temperature Vin for the D/A converter 110. The control logic 130 operates to repeatedly measure the temperature of the D/A converter 110 and generate the control output to the heating device 120 to regulate the temperature of the D/A converter 110. By regulating the temperature of the D/A converter 110 in this manner, the method operates to reduce inaccuracies caused by temperature drift in the D/A converter 110.

FIG. 4 Diagram for Temperature Control Servoloop

FIG. 4 shows a temperature servo loop which illustrates operation of the present invention. Vin denotes the input control voltage to the loop and represents the desired voltage of the chip. The constant voltage Vin controls the temperature of the D/A converter chip 110. The feedback signal Vfb is subtracted from Vin by a subtraction element 160. The feedback signal Vfb is obtained from the temperature sensing nodes of the D/A converter 110. In other words, the feedback signal Vfb is derived from the measured temperature of the chip comprising the D/A converter 110, or the measured temperature of the D/A converter 110 itself.

The result of subtracting Vfb from Vin is the loop error and is denoted Verr. Verr is fed from the subtraction element 160 into a loop controller 162, which is a voltage amplifier which performs amplification. The loop controller 162 outputs an output control signal referred to as Vctrl. The Vctrl signal is then provided to the heater 120 that transforms the input voltage to a temperature difference dTh with respect to the ambient or surrounding temperature dTs. The result is the heater voltage Th at the output of the summing node.

The logic 170 is not comprised in the control logic 130. Rather, the logic 170 represents the physical effect of the heat applied to the D/A converter 110, and shows the derivation of the resultant temperature Tc of the chip or D/A converter 110. The resultant temperature Tc on the chip is derived through the resistive division of the thermal resistance R1 from the heater to the chip and R2 from the chip to the surroundings.

The chip temperature Tc is sensed and transformed back to voltage through the temperature sensing nodes with the gain At provided by thermo sensor 164. Voff denotes the offset of the temperature sensing device. The offset temperature Voff is subtracted from the output of the Thermo sensor 164. The offset temperature Voff is subtracted due to do the relation between the chip temperature and the voltage applied to the "primary reference". More particularly, the thermo sensor 164 and the subtraction element 166 model the equation:

$$Vtmp = At \times T - Voff$$

The resultant voltage is the feedback signal Vfb, which is provided to the subtraction element 160 as described above.

From feedback theory it can be shown that the sensitivity of the chip temperature Tc from the change of surrounding temperature Ts is:

$$\frac{Tc}{Ts} = \frac{1}{1+A} \approx \frac{1}{A} \qquad \text{Equation 1}$$

where A denotes the total loop gain. The total loop gain can be calculated from Equation 2:

$$A = Al \times Ah \times At \times \frac{R2}{R1 + R2} \qquad \text{Equation 2}$$

By substituting A from Equation 2 into Equation 2, the following is obtained:

$$\frac{Tc}{Ts} = \frac{R1 + R2}{R2 \times Al \times Ah \times At} \qquad \text{Equation 3}$$

From Equation 3 it is apparent that the sensitivity of chip temperature to surrounding temperatures can be made arbitrarily small by applying sufficient high gain A1 to the loop controller.

Figure 5:
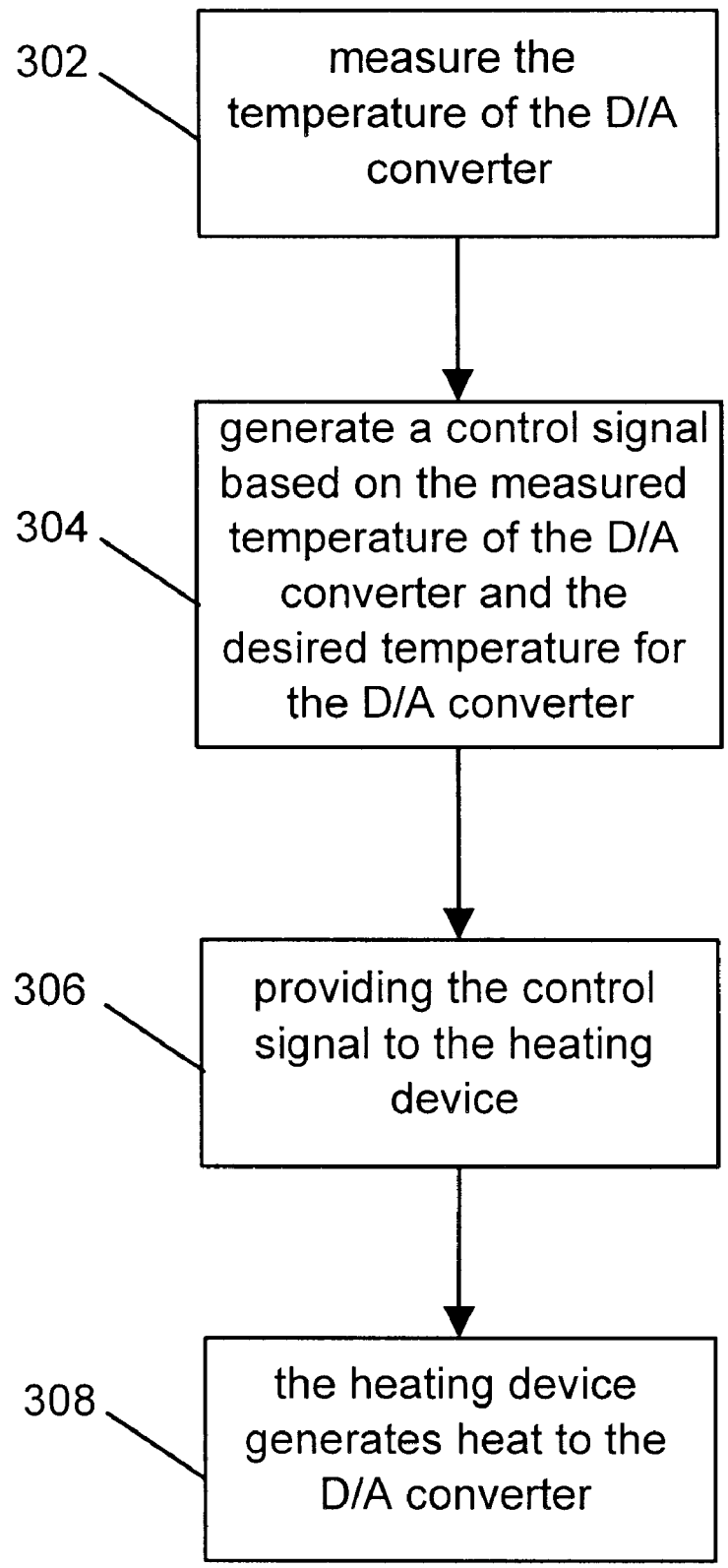
FIG. 5 is a flowchart diagram illustrating operation of the present invention.

FIG. 5—Flowchart Diagram

FIG. 5 is a flowchart diagram illustrating operation of the present invention. As shown, the present invention comprises a method of regulating the temperature of a D/A converter. First, in step 302, the method measures the temperature of the D/A converter. This comprises calculating the difference in voltage between a base voltage and a power input signal to the D/A converter.

In step 304 the method generates a control signal based on the measured temperature of the D/A converter and the desired temperature for the D/A converter. Generating the control signal comprises first receiving a desired temperature signal Vin which indicates a desired temperature for the D/A converter. The method then subtracts a voltage Vfb from Vin, wherein Vfb corresponds to the measured temperature of the D/A converter. This subtracting generates an error signal Verr. The error signal Verr is then amplified to produce the control signal.

In step 306 the method provides the control signal to a heating device thermally coupled to the D/A converter. In step 308 the heating device generates heat to the D/A converter in response to the control signal. It is noted that steps 302–308 of measuring, generating, providing and generating heat are repetitively performed in a servo loop to regulate the temperature of the D/A converter, and hence to reduce inaccuracies caused by temperature drift in the D/A converter.

Numerous variations and modifications will become apparent to those skilled in the art once the above disclosure is fully appreciated. It is intended that the following claims be interpreted to embrace all such variations and modifications.

What is claimed is:

1. A method of regulating the temperature of a D/A converter chip, the method comprising:

measuring the temperature of the D/A converter chip, wherein said measuring the temperature includes calculating the difference in voltage between a base voltage input to the D/A converter chip and a power input signal input to the D/A converter chip;

providing a control signal to a heating device thermally coupled to the D/A converter chip, wherein said control signal is generated based on the measured temperature of the D/A converter chip and the desired temperature for the D/A converter chip;

the heating device generating heat to the D/A converter chip in response to said control signal;

repeating said steps of measuring, providing and generating to regulate the temperature of the D/A converter chip.

2. The method of claim 1, wherein said steps of measuring, providing and generating are repeated in a servo loop.

3. The method of claim 1, wherein said providing said control signal to the heating device comprises:

receiving a desired temperature signal Vin which indicates a desired temperature for the D/A converter chip;

subtracting a voltage Vfb from Vin, wherein Vfb corresponds to the measured temperature of the D/A converter chip, wherein said subtracting generates an error signal Verr;

amplifying said error signal Verr to produce said control signal.

4. The method of claim 1, wherein said base voltage is a base voltage of a transistor comprised in the D/A converter chip;

wherein the power input signal to the D/A converter chip is a voltage V(−) provided as an input to the D/A converter chip.

5. The method of claim 1, wherein the method operates to reduce inaccuracies caused by temperature drift in the D/A converter chip.

6. A system for regulating the temperature of a D/A converter chip, the system comprising:

a heating device in thermal contact with the D/A converter chip;

a temperature sensing control circuit coupled to the D/A converter chip and the heater, wherein the temperature sensing control circuit receives a desired temperature signal Vin which indicates a desired temperature for the D/A converter chip, wherein the temperature sensing control circuit measures the temperature of the D/A converter chip by calculating a difference in voltage between a base voltage input to the D/A converter chip and a power input signal input to the D/A converter chip;

wherein the temperature sensing control circuit provides a control output to the heating device to regulate the temperature of the D/A converter chip, wherein the control output is generated in response to the measured temperature of the D/A converter chip and the desired temperature for the D/A converter chip.

7. The system of claim 6, wherein the temperature sensing control circuit repeatedly measures the temperature on the D/A converter chip and repeatedly provides the control output to the heating device to regulate the temperature of the D/A converter chip.

8. The system of claim 6, wherein the temperature sensing control circuit comprises:

an input for receiving a desired temperature signal Vin which indicates a desired temperature for the D/A converter chip;

a subtraction unit coupled to the input for subtracting a voltage Vfb from Vin, wherein Vfb corresponds to the measured temperature of the D/A converter chip, wherein said subtraction unit generates an error signal Verr;

an amplifier coupled to the subtraction unit for amplifying said error signal Verr to produce said control signal.

9. The system of claim 8, wherein the temperature sensing control circuit includes a first input which is coupled to receive the base voltage of the D/A converter chip and a second input which is coupled to receive the power input signal to the D/A converter chip.

10. The system of claim 6, wherein said base voltage is a base voltage of a transistor comprised in the D/A converter chip;

wherein the power input signal to the D/A converter chip is a voltage V(−) provided as an input to the D/A converter chip.

11. A method of measuring the temperature of a D/A converter chip, the method comprising:

receiving a base voltage of the D/A converter chip;

receiving a power input signal to the D/A converter chip; and measuring the temperature on the D/A converters, wherein said measuring the temperature includes calculating the difference in voltage between the base voltage of the D/A converter chip and a power input signal to the D/A converter chip.

12. The method of claim 11, further comprising:

generating a control signal based on the measured temperature of the D/A converter chip and a desired temperature for the D/A converter chip, wherein the control signal is provided to a heating device thermally coupled to the D/A converter chip to regulate the temperature of the D/A converter chip.

13. A method of regulating the temperature of a chip, the method comprising:

measuring the temperature of the chip, wherein said measuring the temperature includes calculating the difference in voltage between a base voltage input to the chip and a power input signal input to the chip;

providing a control signal to a heating device thermally coupled to the chip, wherein said control signal is generated based on the measured temperature of the chip and the desired temperature for the chip;

the heating device generating heat to the chip in response to said control signal;

repeating said steps of measuring, providing and generating to regulate the temperature of the chip.

14. The method of claim 13, wherein said providing said control signal to the heating device comprises:

receiving a desired temperature signal Vin which indicates a desired temperature for the chip;

subtracting a voltage Vfb from Vin, wherein Vfb corresponds to the measured temperature of the chip, wherein said subtracting generates an error signal Verr;

amplifying said error signal Verr to produce said control signal.

15. The method of claim 13, wherein said base voltage is a base voltage of a transistor comprised in the chip;

wherein the power input signal to the chip is a voltage V(−) provided as an input to the chip.

16. The method of claim 13, wherein the method operates to reduce inaccuracies caused by temperature drift in the chip.

17. A system for regulating the temperature of a chip, the system comprising:

a heating device in thermal contact with the chip;

a temperature sensing control circuit coupled to the chip and the heater, wherein the temperature sensing control circuit receives a desired temperature signal Vin which indicates a desired temperature for the chip, wherein the temperature sensing control circuit measures the temperature of the chip by calculating a difference in voltage between a base voltage input to the chip and a power input signal input to the chip;

wherein the temperature sensing control circuit provides a control output to the heating device to regulate the temperature of the chip, wherein the control output is generated in response to the measured temperature of the chip and the desired temperature for the chip.

18. The system of claim 17, wherein the temperature sensing control circuit repeatedly measures the temperature on the chip and repeatedly provides the control output to the heating device to regulate the temperature of the chip.

19. The system of claim 17, wherein the temperature sensing control circuit comprises:

an input for receiving a desired temperature signal Vin which indicates a desired temperature for the chip;

a subtraction unit coupled to the input for subtracting a voltage Vfb from Vin, wherein Vfb corresponds to the measured temperature of the chip, wherein said subtraction unit generates an error signal Verr;

an amplifier coupled to the subtraction unit for amplifying said error signal Verr to produce said control signal.

20. The system of claim 19, wherein the temperature sensing control circuit includes a first input which is coupled to receive the base voltage of the chip and a second input which is coupled to receive the power input signal to the chip.

21. The system of claim 17, wherein said base voltage is a base voltage of a transistor comprised in the chip;

wherein the power input signal to the chip is a voltage V(−) provided as an input to the chip.

* * * * *

UNITED STATES PATENT AND TRADEMARK OFFICE
CERTIFICATE OF CORRECTION

PATENT NO. : 5,935,466

DATED : August 10, 1999

INVENTOR(S) : Niels Knudsen

It is certified that error appears in the above-identified patent and that said Letters Patent is hereby corrected as shown below:

In the Claims:

Claim 11, col. 8, line 39, please delete "converters" and substitute --converter chip--.

Signed and Sealed this

Twenty-eighth Day of December, 1999

Attest:

Q. TODD DICKINSON

Attesting Officer

Acting Commissioner of Patents and Trademarks